US011329085B2

(12) United States Patent
Wang et al.

(10) Patent No.: US 11,329,085 B2
(45) Date of Patent: May 10, 2022

(54) PIXEL ARRAY WITH ISOLATED PIXELS

(71) Applicant: OmniVision Technologies, Inc., Santa Clara, CA (US)

(72) Inventors: Qin Wang, San Jose, CA (US); Gang Chen, San Jose, CA (US)

(73) Assignee: OMIVISION TECHNOLOGIES, INC., Santa Clara, CA (US)

( * ) Notice: Subject to any disclaimer, the term of this patent is extended or adjusted under 35 U.S.C. 154(b) by 13 days.

(21) Appl. No.: 16/548,697

(22) Filed: Aug. 22, 2019

(65) Prior Publication Data

US 2021/0057466 A1 Feb. 25, 2021

(51) Int. Cl.
*H01L 27/146* (2006.01)
(52) U.S. Cl.
CPC .... *H01L 27/1463* (2013.01); *H01L 27/14643* (2013.01); *H01L 27/14689* (2013.01)
(58) Field of Classification Search
CPC ........... H01L 27/1463; H01L 27/14689; H01L 2924/12043; H01L 27/14643–14663; H01L 27/146–14893; H01L 27/14665–14676; H01L 27/14603–14616
See application file for complete search history.

(56) References Cited

U.S. PATENT DOCUMENTS

| 9,923,009 | B1 * | 3/2018 | Hsiung | H01L 27/14629 |
|---|---|---|---|---|
| 2016/0204144 | A1 * | 7/2016 | Lee | H01L 27/14687 257/229 |
| 2018/0286896 | A1 * | 10/2018 | Kim | H01L 27/1464 |
| 2019/0064733 | A1 * | 2/2019 | Tachibe | G03G 15/04054 |
| 2020/0176420 | A1 * | 6/2020 | Or-Bach | H01L 23/473 |
| 2021/0020670 | A1 * | 1/2021 | Chou | H01L 27/14629 |
| 2021/0029311 | A1 * | 1/2021 | Webster | H01L 27/14643 |
| 2021/0143364 | A1 * | 5/2021 | Jin | H01L 51/50 |

* cited by examiner

*Primary Examiner* — Shahed Ahmed
(74) *Attorney, Agent, or Firm* — Christensen O'Connor Johnson Kindness PLLC

(57) ABSTRACT

A pixel array includes a semiconductor substrate, a plurality of isolation layer segments, and a plurality of photodiodes. Each of the plurality of isolation layer segments extends through the semiconductor substrate in a first direction. Each of the plurality of isolation layer segments encloses a portion of the semiconductor substrate in a plane perpendicular to the first direction. The plurality of isolation layer segments form a grid that defines a plurality of isolated sections of the semiconductor substrate. The plurality of isolated sections of the semiconductor substrate include the portions of the semiconductor substrate. Each of the photodiodes is formed in a respective one of the plurality of isolated sections of the semiconductor substrate.

6 Claims, 7 Drawing Sheets

PIXEL ARRAY WITH ISOLATED PIXELS

BACKGROUND INFORMATION

Field of the Disclosure

The present invention relates generally to pixel arrays, and more specifically, to photodiode pixel arrays with isolated pixels.

Background

Image sensors include pixel arrays with photodiodes. Photodiodes may acquire charge when contacted by light. The acquired charge may spread to other areas of a pixel array in an effect called blooming. As pixel arrays become smaller, blooming may become more of a problem.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
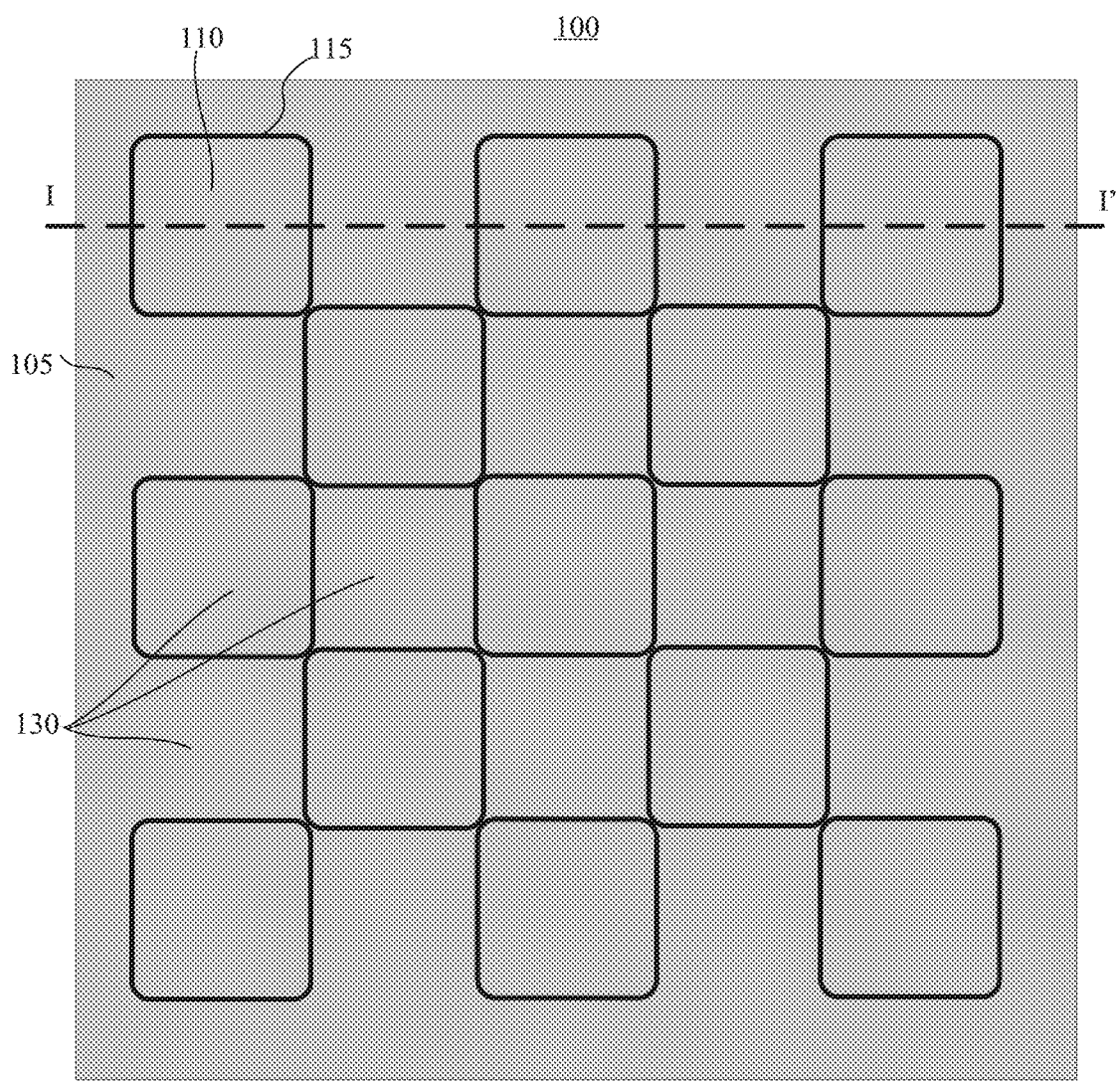
FIGS. 1A-1B illustrate an example of a top view of a pixel array with isolated photodiodes at different steps of the formation of the pixel array with isolated photodiodes in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to pixel arrays with isolated pixels, and methods for fabricating the same using a sacrificial replacement layer are disclosed herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Arrays of pixels with good photodiode isolation allow the photodiodes disposed below the array of color filters to be more accurate. Side walls isolating individual photodiodes in the array of pixels allow the pixel array with isolated photodiodes to have good photodiode isolation. However, the side walls formed by standard photolithography methods can take up a significant amount of space and reduce the occupancy density of the pixel array with isolated photodiodes.

Figure 1B:
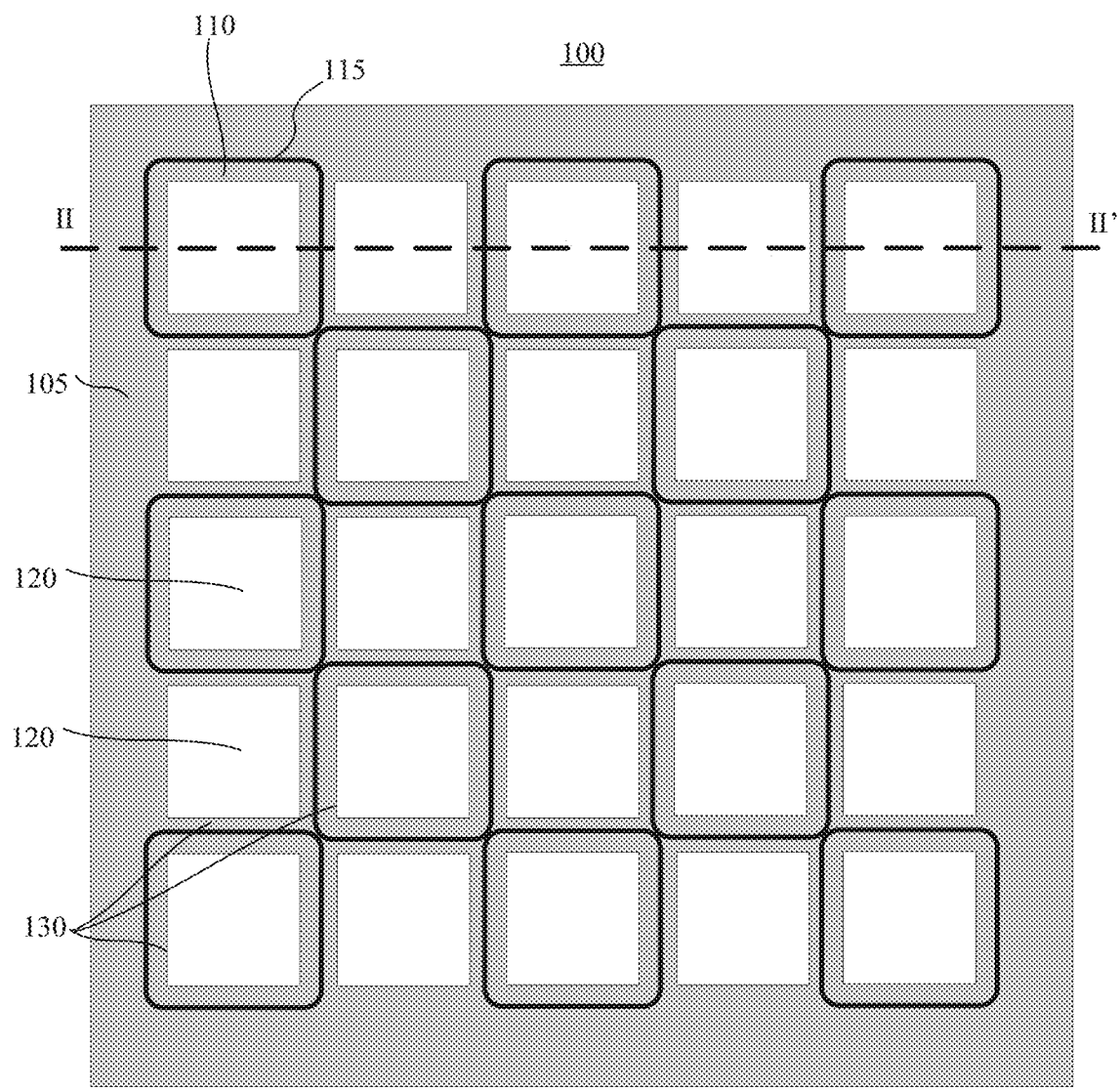

FIGS. 1A-1B illustrate an example of a top view of a pixel array 100 with isolated photodiodes 120 at different steps of the formation of the pixel array 100 with isolated photodiodes 120 in accordance with the teachings of the present invention.

FIG. 1A illustrates a pixel array 100 including a substrate material 105, isolated substrate material areas 110, and isolation layer segments 115. The isolated substrate material areas 110 are defined by the isolation layer segments 115. Or restated, the isolation layer segments 115 surround the isolated substrate material areas 110 in a first plane. Each isolated substrate material area 110 may have a quasi-quadrilateral shape. The isolation provided by the isolation layer segments 115 may be both isolation from direct contact with other portions of the substrate material 105 and electrical isolation due to the high insulative properties of the isolation layer segments 115. The isolation layer segments 115 also define a grid. The grid defines a plurality of isolated sections 130 of the substrate material 105 in an array of isolated sections 130. The isolated sections of the substrate material 105 include the isolated substrate material areas 110.

Some of the isolated sections 130 on the periphery of the array of isolated sections 130 may not have an isolation layer segment 115 on an outer side of the array of isolated sections 130 isolating the isolated section 130. In some examples, especially in large pixel arrays, the outermost isolation layer sections 130 may be used as redundant dummy pixels. In other examples, additional isolation layers (not shown) may be formed to isolate the isolation layer segments 130 on the periphery of the array of isolated section 130.

FIG. 1B illustrates a pixel array 100 similar to the pixel array 100 of FIG. 1A except with photodiodes 120 formed in the substrate material 105. Each photodiode 120 is formed in one of the isolated sections 130 of the substrate material 105. FIG. 1B shows a pixel array that is 5×5 with the isolated sections 130 of the substrate material 105 arranged in a checkerboard pattern. However, the pixel array may be any size or dimension and the isolated sections 130 of the substrate material 105 may be arranged in any shape or pattern. Each isolated photodiode 120 may be a pixel in the pixel array 100.

FIGS. 2A-2H illustrate an example of a cross section view of pixel array with isolated photodiodes 260 at different steps of the formation of the pixel array with isolated photodiodes 260 in accordance with the teachings of the present invention.

Figure 2A:
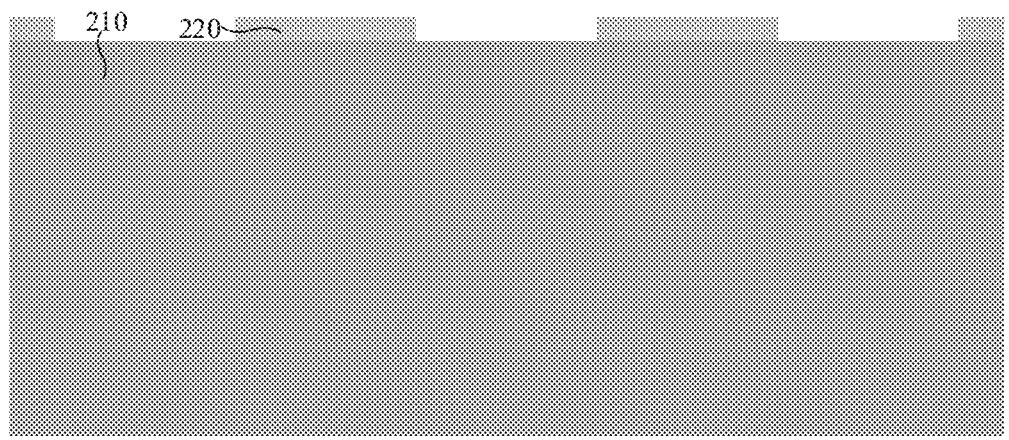
FIGS. 2A-2H illustrate an example of a cross section view of pixel array with isolated photodiodes at different steps of the formation of the pixel array with isolated photodiodes in accordance with the teachings of the present invention.

FIG. 2A illustrates a substrate material 210 with a mask pattern 220 formed on the substrate material 210. The substrate material 210 may be a semiconductor material such as silicon. The mask pattern 220 may be a hard mask. The mask pattern 220 may be formed in a checkerboard grid on the substrate material 210.

Figure 2B:
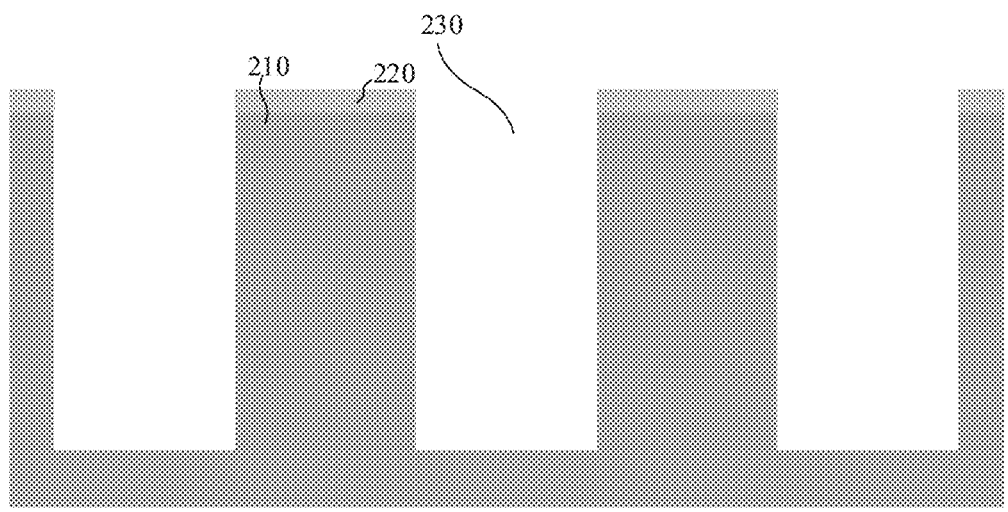

FIG. 2B illustrates the device of FIG. 2A with trenches 230 removed from the substrate material 210. The trenches 230 may be removed through a deep trench isolation etching process using the mask pattern 220. Accordingly, the trenches 230 may be removed between segments of the mask pattern 220.

Figure 2C:
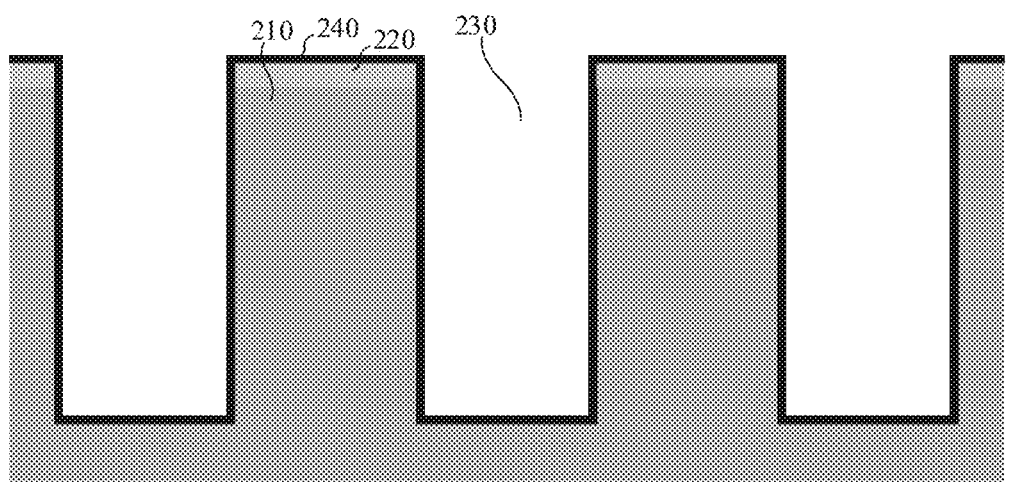

FIG. 2C illustrates the device of FIG. 2B with an isolation layer 240 formed in the trench 230. The isolation layer 240 may be formed by atomic layer deposition and may also be formed on the mask pattern 220. The isolation layer 240 may comprise layers of oxide material and/or polymer material, such as an oxide-poly-oxide atomic layer deposition pattern, where layers of oxide material and polymer material are deposited in alternating layers. The isolation layer 240 may be more resistive to electric currents than the substrate material 210.

Figure 2D:
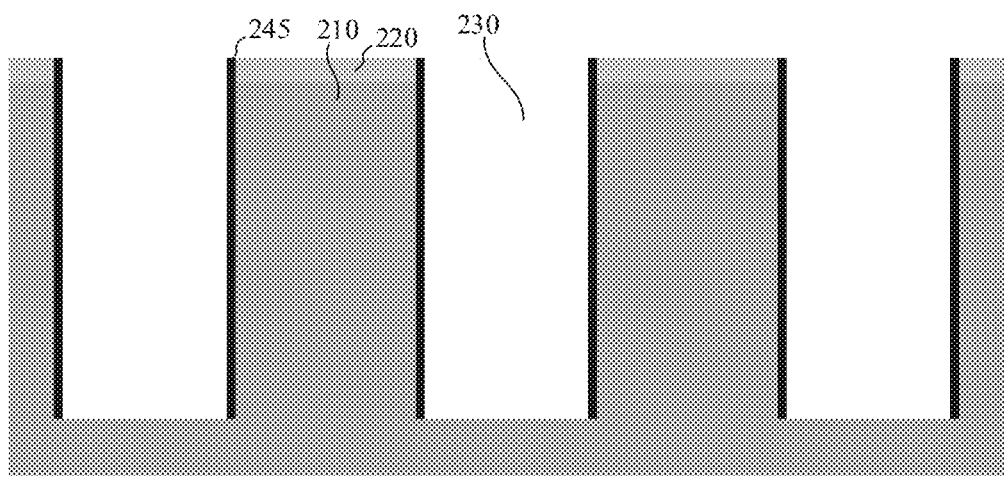

FIG. 2D illustrates the device of FIG. 2C with the isolation layer 240 removed from the bottom of the trenches 230 to leave isolation layer segments 245 on the sides of the trenches 230. The isolation layer 240 may be removed from the bottom of the trenches 230 by an anisotropic etching process. The removing of the isolation layer 240 from the bottom of the trench 230 may also remove the isolation layer 240 from on top of the mask pattern 220.

Figure 2E:
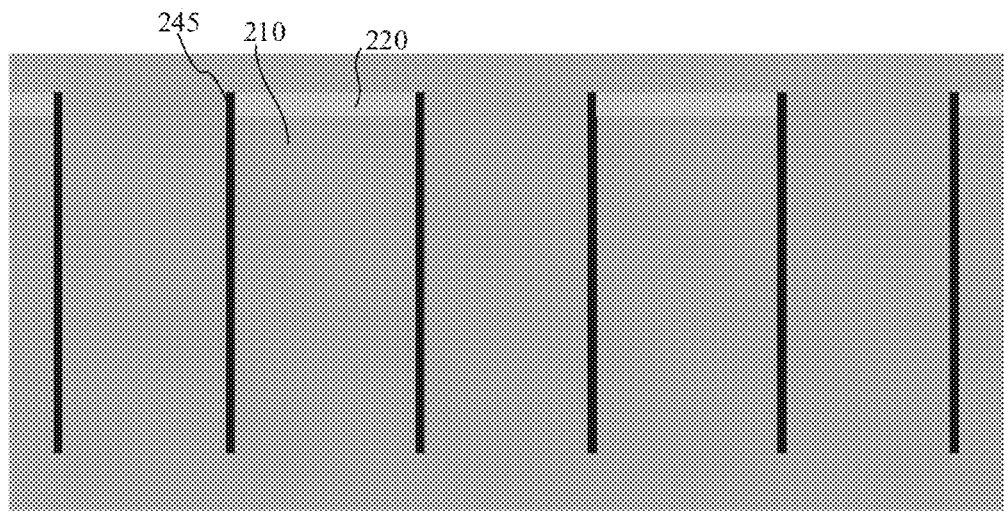

FIG. 2E illustrates the device of FIG. 2D with more of the substrate material 210 formed in the trenches 230. The substrate material 210 may be formed by epitaxial growth. The substrate material 210 formed by epitaxial growth and may be grown over the mask pattern 220.

Figure 2F:
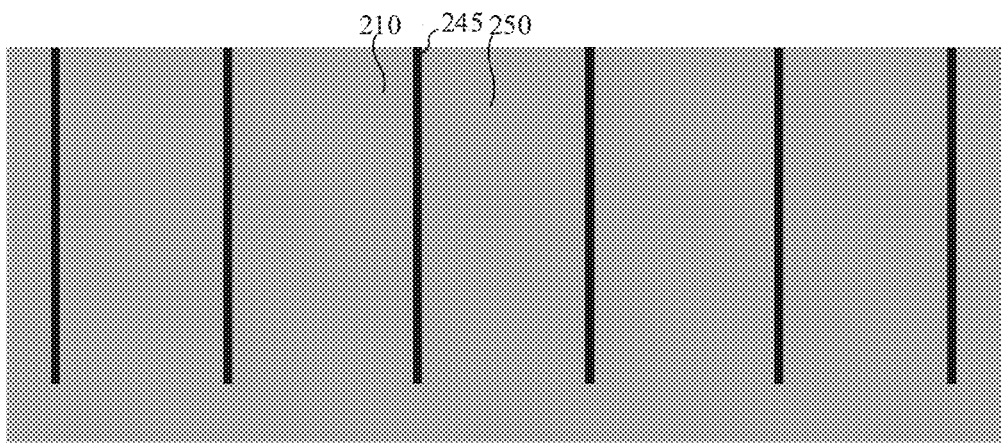

FIG. 2F illustrates the device of FIG. 2E with the mask pattern 220, the substrate material 210 above (relative to the illustration in FIG. 2F, the device may be in any orientation) the mask pattern 220, and the isolation layer segments 245 removed. The substrate material 210 and mask pattern 220 may be removed by chemical mechanical planarization. The removal of the substrate material 210 and mask pattern 220 increases the isolation of the substrate material areas 250.

Figure 2G:
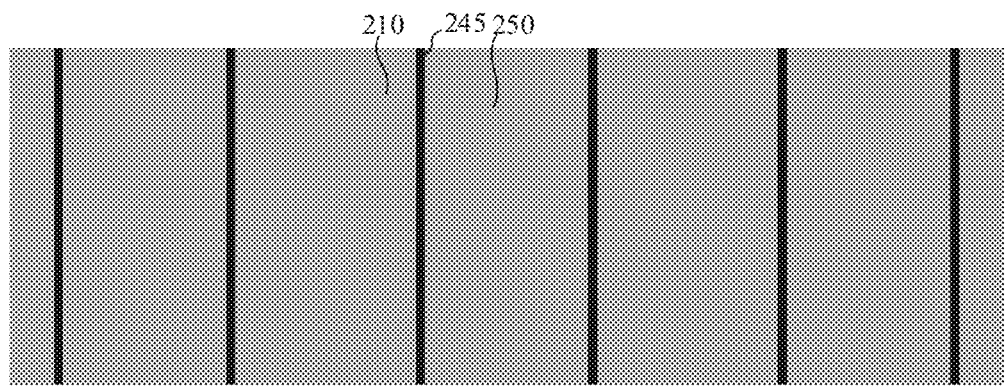

FIG. 2G illustrates the device of FIG. 2F with the substrate material 210 below (relative to the illustration in FIG. 2G, the device may be in any orientation) the isolation layer segments 245 removed. The substrate material 210 may be removed by chemical mechanical planarization. The removal of the substrate material 210 completely isolates the substrate material areas 250. FIG. 2G may be a cross section view of the pixel array 100 of FIG. 1B along the line I-I'.

The isolation layer segments 245 may be examples of the isolation layer segments 115 of FIG. 1A. The isolation layer segments 245, 115 may extend completely through the substrate material 105, 210 in a first direction (e.g., vertical in FIG. 2G, into the surface in FIG. 1A). The first direction is perpendicular to the first plane in which the isolation layer segment 115 encloses a portion of the substrate material 105.

Figure 2H:
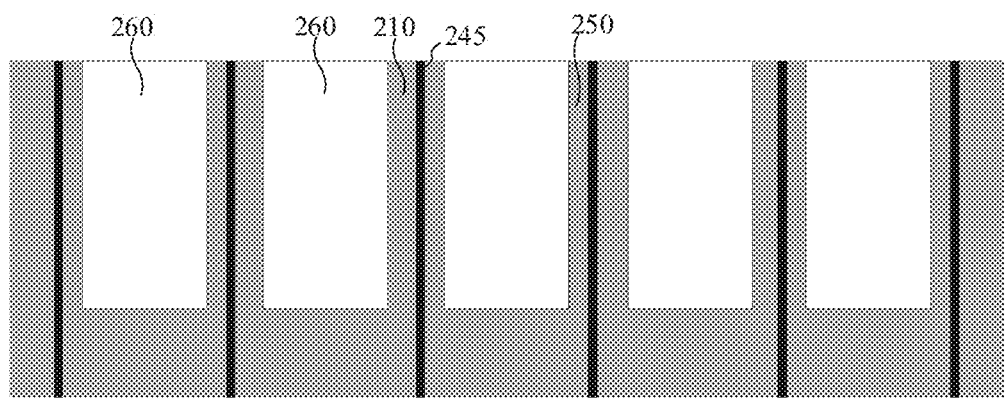

FIG. 2H illustrates the device of FIG. 2G with photodiodes 260 formed in the substrate material 210. One photodiode 260 may be formed in each substrate material area 250 and in the substrate material 210 between the isolation layer segments 245. The photodiodes 260 may be formed by processes known in the art. FIG. 2H may be a cross section view of the pixel array 100 of FIG. 1B along the line II-II'.

Figure 3:
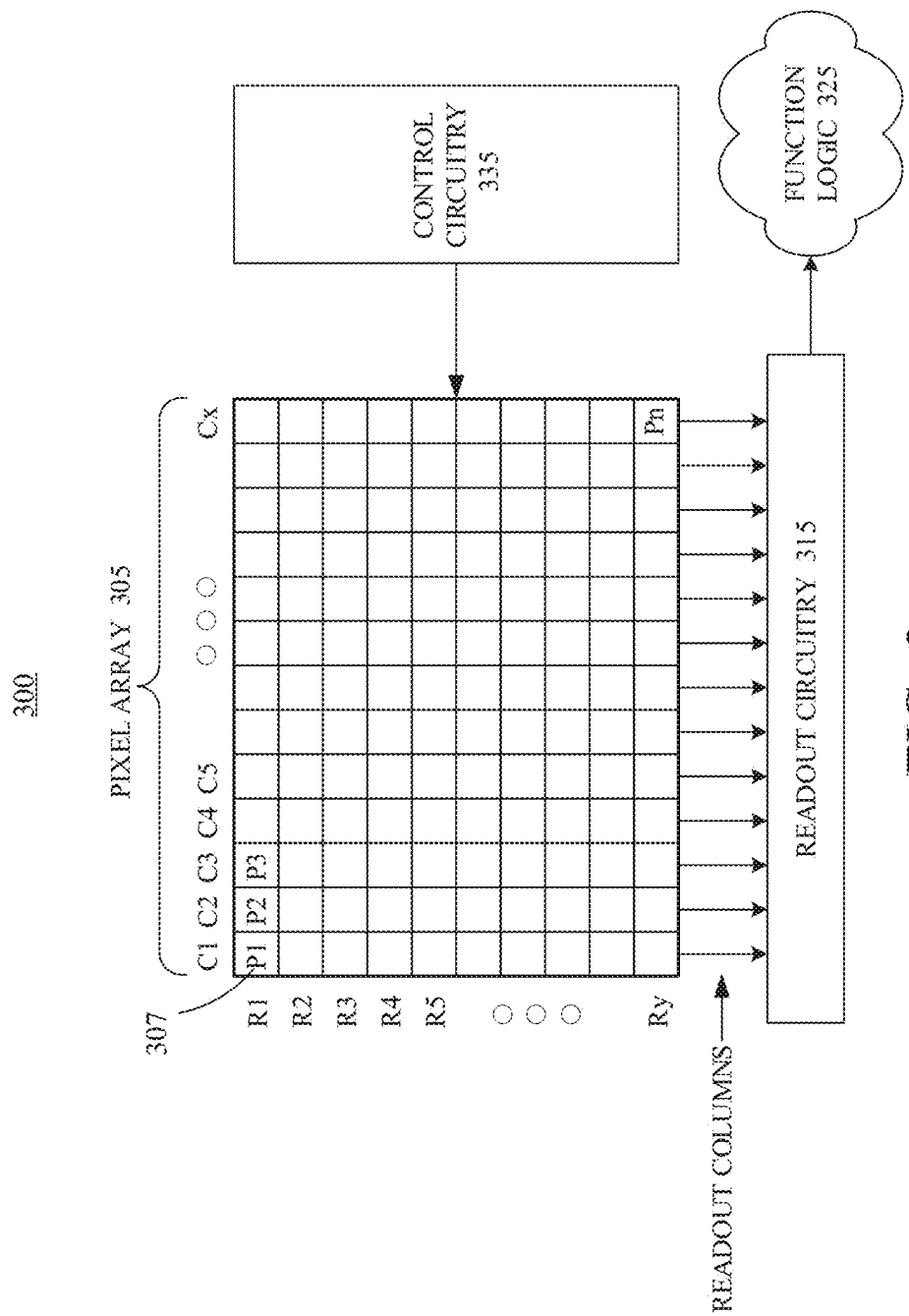
FIG. 3 is a diagram illustrating one example of an imaging system with a pixel array with isolated photodiodes in accordance with the teachings of the present invention.

FIG. 3 is a diagram illustrating one example of an imaging system 300 with a pixel array 305 with isolated photodiodes (pixels) 307 in accordance with the teachings of the present invention. As shown in the depicted example, an imaging system 300 includes a pixel array 305 coupled to a control circuitry 335 and a readout circuitry 315, which is coupled to a function logic 325.

Pixel array 305 is a two-dimensional ("2D") array of pixels 307 (e.g., pixels P1, P2 . . . , Pn). In one embodiment, each pixel is a complementary metal-oxide-semiconductor ("CMOS") imaging pixel. Pixel array 305 may be implemented as either a front side illuminated image sensor array or a backside illuminated image sensor array. In one embodiment, pixel array 305 includes a pixel array with isolated pixels, such as the pixel array with isolated pixels depicted in FIG. 1B or FIG. 2H. The pixel array 305 with isolated pixels includes a plurality of pixels 307. As illustrated, each pixel 307 is arranged into a row (e.g., rows R1 to Ry) and a column (e.g., column C1 to Cx) to acquire image data of a person, place, or object, which can then be used to render a 2D image of the person, place, or object.

In one embodiment, after each pixel 307 has acquired its image data or image charge, the image data is readout by readout circuitry 315 and transferred to function logic 325. Readout circuitry 315 may include amplification circuitry, e.g., a differential amplifier circuitry, analog-to-digital ("ADC") conversion circuitry, or otherwise.

Function logic 325 may include logic and memory for storing the image data or even manipulating the image data by applying post image effects (e.g., crop, rotate, remove red eye, adjust brightness, adjust contrast, or otherwise). In one example, the readout circuitry 315 may readout a row of image data at a time along readout column lines (illustrated) or may readout the image data using a variety of other techniques (not illustrated), such as a serial readout or a full parallel readout of all pixels simultaneously.

Control circuitry 335 is coupled to pixel array 305. Control circuitry 335 may include logic and memory for controlling operational characteristic of pixel array 305. For example, control circuitry 335 may generate a shutter signal for controlling image acquisition. In one embodiment, the shutter signal is a global shutter signal for simultaneously enabling all pixels 307 within pixel array 305 to simultaneously capture their respective image data during a single acquisition window. In an alternative embodiment, the shutter signal is a rolling shutter signal whereby each row, column, or group of pixels is sequentially enabled during consecutive acquisition windows.

Figure 4:
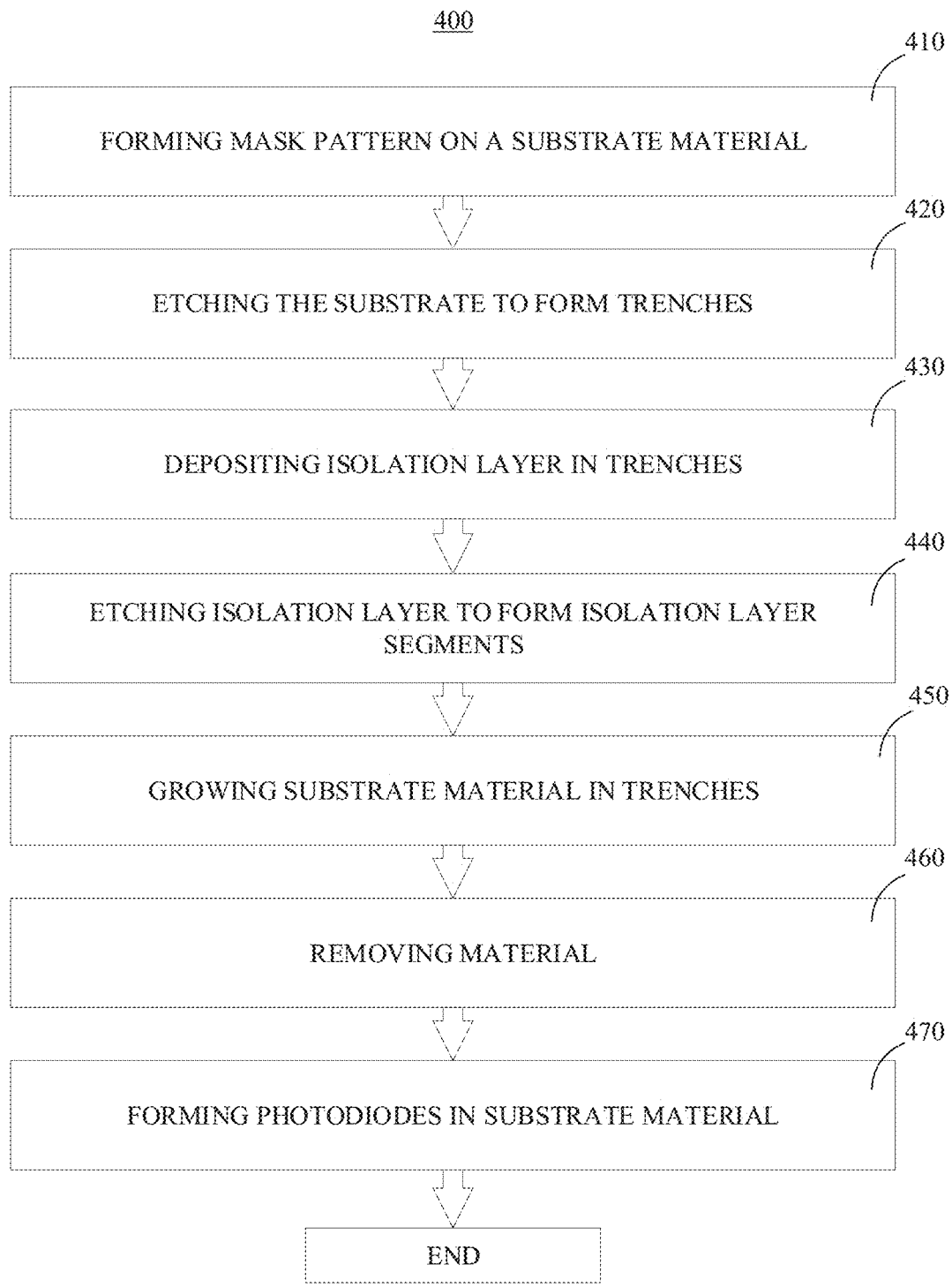
FIG. 4 is a flow diagram illustrating processing steps to fabricate one example of a pixel array with isolated photodiodes in accordance with the teachings of the present invention.

FIG. 4 is a flow diagram 400 illustrating processing steps to fabricate one example of a pixel array with isolated photodiodes in accordance with the teachings of the present invention.

At block 410, a mask pattern 220 may be formed on a substrate material 210. The mask pattern 220 may be a hard mask pattern formed in a checker board pattern by processes known in the art.

At block 420, the substrate material 210 may be etched to form trenches 230. The substrate material 210 may be etched by a deep trench isolation technique. Generally, the final pixel array will have greater full well capacity and quantum efficiency with thicker substrate material 210. Accordingly, the trenches 230 are etched as deep as possible in substrate material 210 using the deep trench isolation technique.

At block 430, the isolation layer 240 may be deposited in the trenches 230. The isolation layer 240 may be deposited using an atomic layer deposition process. The isolation layer 240 may be formed in the trenches 230 and also on the mask pattern 220.

At block 440, the isolation layer 240 may be etched to form the isolation layer segments 245. The isolation layer 240 may be removed from the bottom of the trenches 230 and the top of the mask pattern 240 using an isotropic etching process.

At block 450, additional substrate material 210 may be grown in the trenches 230. The substrate material 210 may be grown by epitaxial growth.

At block 460, material may be removed from the device. Material, including substrate material 210 above the isolation layer segments 245 and the hard mask pattern 220, may be removed by chemical mechanical planarization. Portions of the isolation layer segments 245 formed on the mask pattern 220 may also be removed. Material including substrate material 210 below the isolation layer segments 245 may be removed by chemical mechanical planarization as well.

At block 470, photodiodes 120, 260 may be formed in the device. The photodiodes 120, 260 may be formed by processes known in the art. Each photodiode 120 may be formed in one of the isolation sections of the substrate material 105.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel array, comprising:
   a semiconductor substrate;
   a plurality of isolation layer segments, wherein each of the plurality of isolation layer segments extends through the semiconductor substrate in a first direction, wherein each of the plurality of isolation layer segments encloses a portion of the semiconductor substrate in a plane perpendicular to the first direction, wherein the plurality of isolation layer segments form a grid that defines a plurality of isolated sections of the semiconductor substrate, wherein the plurality of isolated sections of the semiconductor substrate include the portions of the semiconductor substrate, wherein the plurality of isolation layer segments includes an oxide material, and wherein the plurality of isolation layer segments include alternating layers of the oxide material and a polymer material; and
   a plurality of photodiodes, wherein each of the photodiodes is formed in a respective one of the plurality of isolated sections of the semiconductor substrate.

2. The pixel array of claim 1, wherein each of the plurality of isolated sections of the semiconductor substrate has a quasi-quadrilateral shape.

3. The pixel array of claim 2, wherein the plurality of isolated sections of the semiconductor substrate are arranged in a checkerboard pattern.

4. The pixel array of claim 1, wherein each of the plurality of isolation layer segments extends completely through the semiconductor substrate in the first direction for an entire height of the semiconductor substrate.

5. The pixel array of claim 1, wherein the plurality of isolation layer segments further includes a polymer material.

6. A pixel array, comprising:
   a semiconductor substrate;
   a plurality of isolation layer segments, wherein each of the plurality of isolation layer segments extends through the semiconductor substrate in a first direction, wherein each of the plurality of isolation layer segments encloses a portion of the semiconductor substrate in a plane perpendicular to the first direction, wherein the plurality of isolation layer segments form a grid that defines a plurality of isolated sections of the semiconductor substrate, wherein the plurality of isolated sections of the semiconductor substrate include the portions of the semiconductor substrate, wherein the plurality of isolation layer segments includes alternating layers of an oxide material and a polymer material; and
   a plurality of photodiodes, wherein each of the photodiodes is formed in a respective one of the plurality of isolated sections of the semiconductor substrate.

* * * * *